(12) United States Patent
Shuto et al.

(10) Patent No.: US 6,585,426 B2
(45) Date of Patent: Jul. 1, 2003

(54) OPTICAL MODULE USING WIRING LEAD INTEGRATED RESIN SUBSTRATE

(75) Inventors: Yoshito Shuto, Hitachi (JP); Michiyuki Amano, Tokyo (JP); Kenji Yokoyama, Tokyo (JP); Takeshi Kurosaki, Zama (JP); Takashi Tadokoro, Isehara (JP); Makoto Nakamura, Isehara (JP); Masanobu Okayasu, Isehara (JP); Noboru Ishihara, Atsugi (JP); Shin Sumida, Tsukuba (JP); Shunichi Tohno, Mito (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 68 days.

(21) Appl. No.: 09/764,785

(22) Filed: Jan. 17, 2001

(65) Prior Publication Data
US 2001/0010744 A1 Aug. 2, 2001

(30) Foreign Application Priority Data
Jan. 18, 2000 (JP) ........................................ 2000-009271

(51) Int. Cl.⁷ .................................................. G02B 6/36
(52) U.S. Cl. .............................. 385/90; 385/88; 385/92; 385/94
(58) Field of Search .............................. 385/90, 89, 88, 385/92, 94

(56) References Cited

U.S. PATENT DOCUMENTS

| | | | | |
|---|---|---|---|---|
| 4,802,178 A | * | 1/1989 | Ury ............................ | 257/712 |
| 5,065,226 A | * | 11/1991 | Kluitmans et al. .......... | 257/433 |
| 5,737,467 A | * | 4/1998 | Kato et al. .................... | 385/78 |
| 6,071,016 A | * | 6/2000 | Ichino et al. ................. | 385/92 |
| 6,227,723 B1 | * | 5/2001 | Masuda et al. ............... | 257/59 |

* cited by examiner

Primary Examiner—Rodney Bovernick
Assistant Examiner—Sung Pak
(74) Attorney, Agent, or Firm—Kilpatrick Stockton LLP

(57) ABSTRACT

An optical module capable of connecting signal lines to an external substrate easily without causing any degradation of the transmission characteristic is disclosed. The optical module comprises an optical element mounting block having an optical element mounting section and an optical fiber guide, and a wiring lead integrated resin substrate having a ferrule holding section, an optical element mounting block housing section, and wiring leads, where at least a part of the wiring leads are provided by signal lines in a coplanar guide structure entirely formed on the wiring lead integrated resin substrate such that a characteristic impedance does not change when the wiring leads are electrically connected to external wirings.

8 Claims, 10 Drawing Sheets

OPTICAL MODULE USING WIRING LEAD INTEGRATED RESIN SUBSTRATE

BACKGROUND OF THE INVENTION

1. Field of the Invention

The present invention relates to an optical module to be used in fields of optical communications and optical information processing, for example, and more particularly, to an optical module for converting optical/electric signals into electric/optical signals by optically connecting an optical element having electric wirings with an optical fiber held by a ferrule and having a tip end portion without jacketing layers that is projecting from the ferrule.

2. Description of the Background Art

In recent years, in conjunction with a drastic increase in the amount of data communications, there is an increasing demand for a photo-detecting or light-emitting optical module for handling high speed optical signals with the optical signal speed of over Gbit/sec (Gbps), for example, and its realization at a cheaper cost. In view of this demand, there are many reports of a method for realizing an optical axis alignment of an optical element and an optical fiber by a mechanical positioning alone (the passive alignment method) by providing a V-groove on a silicon substrate. There are also reports of a technique for molding this optical element mounted silicon substrate together with lead frames.

In the conventional passive alignment method, in the case of processing high speed signals with the optical signal speed over 10 Gbps, it is known that the use of materials having a lower dielectric constant than silicon is advantageous because of the decrease of the parasitic capacity. However, this in turn requires signal line wirings with very minute intervals so that there is a problem that it becomes difficult to manufacture a mold package using lead frames which is advantageous for realization of low cost.

FIG. 1 shows a perspective view of a structure of a conventional optical module. This optical module is a photo-detecting optical module using an ordinary resin package with metallic lead frames, which is manufactured by mounting a photo-diode having an equivalent frequency characteristic as that of a photo-detecting optical module of the present invention shown in FIG. 7 to be described below and a pre-amplifier IC on a package made of a uniform resin material and having a shape in which metallic leads are independently projected into the lateral directions. Namely, in this conventional optical module, a frame 92 is attached on a plastic substrate 91 to enclose its surrounding, and a quartz glass V-groove substrate 93 is provided at an approximate center of the plastic substrate 91 inside this frame 92. A photo-diode 11 is implemented on this quartz glass V-groove substrate 93, and this photo-diode 11 and an optical fiber 5 are optically connected as a tip end portion 5a without jacketing layers of the optical fiber 5 abuts against this photo-diode 11.

The optical fiber 5 is fixed by being set in a V-groove 93a that is formed on the quartz glass V-groove substrate 93 along the optical fiber 5 underneath the optical fiber 5, and a portion projecting out from the quartz glass V-groove substrate 93 is held by a ferrule 7, where this ferrule 7 is fixedly held at a notch section 92a formed on the frame 92.

Also, a pre-amplifier IC 9 is provided adjacent to one end of the quartz glass V-groove substrate 93 on the plastic substrate 91, and this pre-amplifier IC 9 is electrically connected to the photo-diode 11 by bonding wires.

In addition, metallic lead frames 94 for pre-amplifier IC and metallic lead frames 95 for signals are provided on the plastic substrate 91, and one ends of these metallic lead frames 94 and 95 are electrically connected to the pre-amplifier IC 9 by bonding wires while the other ends are projected outside the plastic substrate 91.

In order to evaluate a receiving bandwidth of the conventional optical module in the above configuration, as shown in FIG. 2, this optical module was mounted on a glass epoxy frequency characteristic evaluation substrate 51 on which a plurality of electrode pads 52, signal lines 53 in a coplanar guide structure, and an SMA type high frequency connector 54 are formed, and they were electrically connected. Then, the receiving characteristic of the conventional optical module shown in FIG. 1 was evaluated in this connection configuration, to obtain the receiving bandwidth measurement result as shown in FIG. 3.

As can be seen in the receiving bandwidth evaluation result shown in FIG. 3, for this conventional optical module, large ripples which are probably caused by electrical reflections were appearing, and a large degradation of the frequency characteristic was observed. In this type of optical module, a characteristic impedance changes at a portion where the signal transmission leads are projected from inside the package to outside, so that the electrical reflections or resonances can occur easily and these electrical reflections or resonances can cause the degradation of the high frequency characteristic. In practice, an effort to prevent the degradation of the high frequency characteristic is made by cutting the signal line leads short and carefully implementing the optical module such that no gap is formed between a package of the optical module and the glass epoxy frequency characteristic evaluation substrate 51.

However, the wiring pattern of the glass epoxy frequency characteristic evaluation substrate 51 is usually formed at approximately 1 mm inner side of the edge as indicated by "d" in FIG. 2, so that this gap of 1 mm remains as a cause of the electrical reflections. For this reason, the large ripples that are probably caused by the electrical reflections were appearing and the large degradation of the frequency characteristic was observed as shown in FIG. 3.

FIG. 4 shows the conventional optical module of FIG. 1 implemented on an optical signal received waveform evaluation substrate which is manufactured by mounting a main amplifier IC 82 on a glass epoxy substrate 81 similar to the glass epoxy frequency characteristic evaluation substrate 51 of FIG. 2, in order to carry out the 10 Gbps optical signal received waveform evaluation with respect to a photo-detecting optical module using a resin package with metallic lead frames in a form of the conventional optical module of FIG. 1. Note that the main amplifier IC 82 is an amplifier having an automatic gain control (AGC) function of the operation frequency bandwidth approximately equal to 10 GHz, which outputs signals having a constant amplitude by uniformly amplifying the received signals as amplified by the pre-amplifier IC 9 used in the conventional optical module of FIG. 1. Using such an optical signal received waveform evaluation substrate, it is possible to output electric signals suitable for the bit error rate characteristic evaluation that is often used for the received waveform observation and the transmission characteristic evaluation.

FIG. 5 shows the evaluation result for the conventional optical module of FIG. 1 obtained by using the optical signal received waveform evaluation substrate of FIG. 4. In this evaluation, the received waveform outputted from the main amplifier IC 82 at a time of receiving optical signals modulated by 10 Gbps pseudo-random pattern (NRZ$2^{23}$–1) with an average power of –10 dBm was observed using a wide bandwidth oscilloscope having a bandwidth of 20 GHz. FIG. 5 shows the observed waveform, which is a largely degraded waveform compared with the correct eye pattern. Also, when the bit error rate characteristic was evaluated in a vicinity of the average power of –10 dBm using the optical signal received waveform evaluation substrate of FIG. 4, it was impossible to realize a completely error free operation without any code recognition error.

Thus the conventional optical module package is associated with a problem that the implementation to connect signal line leads to an external substrate requires considerable cares in order to transmit the high speed signals with the optical signal speed over 10 Gbps to the external substrate without causing any degradation.

Also, the conventional optical module has a problem the characteristic impedance changes at a portion where the signal transmission leads are projected from inside the packet to outside, so that the electrical reflections or resonances can occur easily to cause the degradation of the high frequency characteristic, as can be seen from the received bandwidth evaluation result described above.

Also, the conventional optical module has a problem that it is impossible to realize a completely error free operation without any code recognition error as can be seen from the bit error rate characteristic evaluation in the optical signal received waveform evaluation described above.

SUMMARY OF THE INVENTION

It is therefore an object of the present invention to provide an optical module capable of connecting signal lines to an external substrate easily without causing any degradation of the transmission characteristic, and an optical module on which very minute wiring pattern can be realized.

According to one aspect of the present invention there is provided an optical module for converting optical/electric signals into electric/optical signals by optically connecting an optical element having electric wirings with an optical fiber held by a ferrule and having a tip end portion without jacketing layers that is projecting from the ferrule, the optical module comprising: an optical element mounting block having an optical element mounting section for mounting the optical element, and an optical fiber guide for guiding the optical fiber to align optical axes of the optical fiber and the optical element, such that the optical fiber is optically connected with the optical element while maintaining a state in which optical axes of the optical fiber and the optical element are aligned; and a wiring lead integrated resin substrate having a ferrule holding section for holding the ferrule, an optical element mounting block housing section for housing the optical element mounting block, and wiring leads to which the optical element is electrically wired; wherein at least a part of the wiring leads are provided by signal lines in a coplanar guide structure entirely formed on the wiring lead integrated resin substrate such that a characteristic impedance does not change when the wiring leads are electrically connected to external wirings.

Other features and advantages of the present invention will become apparent from the following description taken in conjunction with the accompanying drawings.

DETAILED DESCRIPTION OF THE PREFERRED EMBODIMENTS

Referring now to FIG. 6 to FIG. 12, one embodiment of an optical module according to the present invention will be described in detail.

Figure 6:
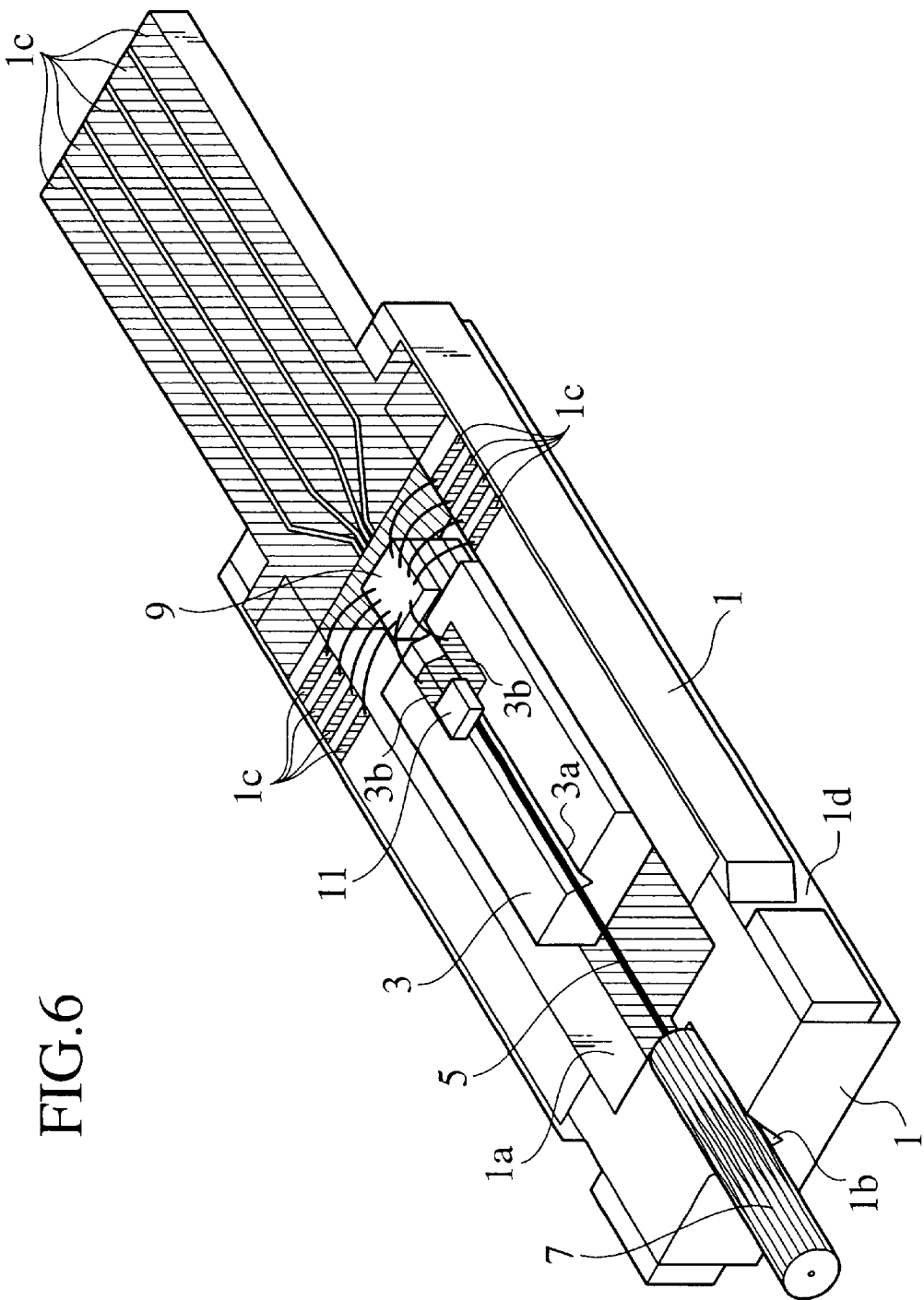
FIG. 6 is a perspective view showing a structure of an optical module according to one embodiment of the present invention.

FIG. 6 shows a perspective view of a structure of an optical module according to one embodiment of the present invention. This optical module is an optical module for converting optical/electric signals into electric/optical signals by optically connecting an optical fiber and a photo-detecting or light emitting optical element, in particular a semiconductor photo-detecting or light-emitting optical element such as a photo-diode. This optical module has a substrate 1 made of resin such as plastic which provides an overall framework of the optical module. This substrate 1 will be referred to as a wiring lead integrated resin substrate 1 because a photo-diode and wiring lead lines for a pre-amplifier IC to be connected to this photo-diode are formed on a part of the surface of this substrate 1 as will be described in further detail below.

This wiring lead integrated resin substrate 1 has an optical element mounting block 3 with the optical element in a form of a photo-diode 11 mounted thereon, arranged at a central portion of the wiring lead integrated resin substrate 1. This photo-diode 11 has a structure for entering lights from an end surface, and a frequency characteristic with a wide bandwidth capable of receiving optical signals up to 20 GHz. In further detail, an arrangement position of the optical element mounting block 3 is provided by a concave section formed by making a central portion of the wiring lead integrated resin substrate 1 hollow, in a form of an optical element mounting block housing section 1a for housing the optical element mounting block 3 therein. Note that the optical element mounting block 3 is formed by a substrate which can be made of semiconductor material, glass material such as quartz glass, ceramics, plastic, etc., where the materials to be used can be selected according to properties of each material such as dielectric constant, dielectric dispersion, and thermal conductivity, in view of a circuit design of the optical module to be manufactured.

Also, the wiring lead integrated resin substrate 1 and the optical element mounting block 3 are made of the same resin. Their manufacturing size precision is often required to be a value less than or equal to 1 µm because there is a need to align an optical axis of the optical fiber 5 accurately.

Also, a groove 1b is formed at one end (left end in FIG. 6) of the wiring lead integrated resin substrate 1, and a ferrule 7 of 1.25 mm diameter that holds the optical fiber 5 is positioned and maintained in this groove 1b. Note that the groove 1b constitutes a ferrule holding section. The optical fiber 5 held by the ferrule 7 in this way is extending toward the optical element mounting block 3 and further along an optical fiber guide 3a in a V-groove structure formed on the optical element mounting block 3, and its tip end portion without jacketing layers is abutted against the photo-diode 11 such that the optical fiber 5 and the photo-diode 11 are optically connected.

Note that the optical fiber guide 3a in the V-groove structure is provided in order to align optical axes of the optical fiber 5 and the photo-diode 11 accurately and guide them such that they are optically connected accurately while maintaining them in a state of having their optical axes aligned. An angle of the V-groove structure constituting the optical fiber guide 3a is not limited to any particular value, but can be chosen in a range between 120 degree and 60 degree, for example. Its manufacturing size precision is preferably a value less than or equal to 1 µm because there is a need to align an optical axis of the optical fiber 5 accurately.

Note also that the optical fiber guide 3a is provided in a form of a V-groove structure with approximately V-shaped cross-section in this embodiment, but the optical fiber guide 3a is not necessarily limited to this particular form and can be formed in a structure with a concave cross-section, or a circular hole structure with a circular cross-section having a diameter slightly larger than a diameter of the optical fiber 5. In the case where the optical fiber guide 3a is in the circular hole structure, a diameter of the circular cross-section is not limited to any particular value, but should preferably be larger than a diameter of the optical fiber 5 by about 0.5 to 1 µm.

Note that the groove 1b constituting the ferrule holding section that is formed at one end of the wiring lead integrated resin substrate 1 has a function as a ferrule guide, such that a receptacle optical module can be formed. More specifically, the ferrule 7 in which the optical fiber 5 is inserted and fixed can be positioned at this groove 1b constituting the ferrule guide section, and a receptacle structure can be selected in accordance with various connector structures such as SC, MU and MT.

In a vicinity of the photo-diode 11 within the optical element mounting block housing section 1a in which the optical element mounting block 3 is housed, a pre-amplifier IC 9 having a frequency characteristic with a wide bandwidth of about 20 GHz, for example, is mounted in a form of a bare chip. Also, the photo-diode 11 is connected with an electrode pattern 3b which is formed on a surface of the optical element mounting block 3 by gold plating, and this electrode pattern 3b is connected with the pre-amplifier IC 9 by bonding wires. Note that the pre-amplifier IC 9 is provided for amplifying feeble electric signals outputted from the photo-diode 11 upon receiving optical signals at the photo-diode 11, and outputting the amplified signals from the optical module. For example, in the case of measuring characteristics of this optical module by using a measurement instrument, the pre-amplifier IC 9 can amplify feeble electric signals from the photodiode 11 to a level observable by the measurement instrument and output the amplified signals from the optical module.

Also, another end of the wiring lead integrated resin substrate 1 is formed slightly thinner than a portion in which the optical element mounting block housing section 1a is formed, and a plurality of signal lines 1c are formed on a surface of this portion by gold plating. Similar signal lines 1c are also formed on a surface of the wiring lead integrated resin substrate 1 in a vicinity of a portion at which the pre-amplifier IC 9 is provided. These signal lines 1c are electrically connected with the pre-amplifier IC 9 by bonding wires. Note that the signal lines 1c constitute wiring leads in the present invention.

Among the leads provided by the signal lines 1c formed on the wiring lead integrated resin substrate 1 as described above, inner side leads are used for signal transmission while two outer leads are used as ground lines, so as to form a coplanar guide structure. As a result, the optical module of this embodiment is capable of realizing the signal transmission bandwidth up to a high frequency range of 10 Gbps or more.

Also, these signal lines 1c in the coplanar guide structure are formed on the resin substrate up to their ends so that signals can be transmitted from the signal lines 1c to the wirings on an external substrate without causing any discontinuity in the characteristic impedance, which is important from a viewpoint of the high frequency characteristic.

Namely, these signal lines 1c are entirely formed on a resin substrate projecting from the optical element mounting block housing section 1a of the wiring lead integrated resin substrate 1 such that these signal lines 1c can be electrically connected to the external wirings without being exposed between the optical module and the external wirings.

As will be described in further detail below, this feature enables the optical module of the present invention to improve the high frequency characteristic such that there is no large ripple due to electrical reflections. In addition, this improved high frequency characteristic in turn enables the optical module of the present invention to improve the eye pattern and realize a completely error free operation without any code recognition error, because the eye pattern is a superposition of various frequency signals so that a good frequency characteristic is necessary in order to obtain a good eye pattern.

The signal lines 1c are formed by forming plating pattern on a resin constituting the wiring lead integrated resin substrate 1. This plating pattern can be formed by using the MID (Molded Interconnect Devices) method for directly forming three-dimensional wirings on a plastic injection molded body. In this method, the mass production of a pattern with wiring interval of less than or equal to 100 µm can be realized easily. For example, a three-dimensional wiring circuit can be formed by plating an injection molded body surface and then patterning.

Note that the signal lines 1c constituting the electric wiring pattern are formed on a surface of the wiring lead integrated resin substrate 1 in this embodiment, but the present invention is not necessarily limited to this case, and the signal lines 1c may be formed to be piercing through interior of the wiring lead integrated resin substrate 1. Also, the resin material of the wiring lead integrated resin substrate should preferably be a material with excellent heat resistance and insulation properties which has no dielectric dispersion in the frequency region to be used. Examples of such material include epoxy resin and engineering plastic such as liquid crystalline polymer.

In addition, a hooking section 1d is formed on a side wall near one end of the wiring lead integrated resin substrate 1, and this hooking section 1d is provided for hooking, i.e., locking the optical module of FIG. 6 by being engaged with an optical connector receptacle portion. By locking an MU connector receptacle that matches this hooking section 1d, it is possible to form a photo-detecting optical module of MU receptacle type.

More specifically, for the resin material of the wiring lead integrated resin substrate 1, a liquid crystalline polymer with the dielectric constant of 4.2 and the excellent environmental tolerance can be used. The wiring lead integrated resin substrate 1 made of such material can be manufactured as follows. First, an overall structure is manufactured by the injection molding technique using a metal mold, and resin that is soluble by solvent such as polyvinyl alcohol or polylactic acid is coated, i.e., formed by the insert molding at a portion that is not to be plated, i.e. a portion corresponding to a negative pattern of the plating pattern. Then, the electroless plating is applied to the surface. Finally, the upper layer resin portion formed by the insert molding, i.e., the resin portion formed on the surface, is removed by the solvent so as to form the plating pattern for the signal lines 1c. For the plating pattern so manufactured, the minimum electrode line interval is 50 μm and the size tolerance is within 2 μm. Note that this is a kind of the MID method so that the mass production of a pattern with wiring interval of less than or equal to 100 μm can be realized easily.

In fabricating the optical module using the wiring lead integrated resin substrate 1 with the plating pattern formed thereon in this way, the photo-diode 11 is mounted at an end portion of the optical fiber guide 3a in the V-groove structure on the optical element mounting block 3. Then, the ferrule 7 is positioned at the groove 1b formed at one end of the wiring lead integrated resin substrate 1, and the optical fiber 5 projecting from an end portion of the ferrule 7 is guided along the optical fiber guide 3a in the V-groove structure and abutted against the photo-diode 11 provided on the V-groove so as to optically connect the optical fiber 5 and the photo-diode 11 and fix the optical fiber 5.

Next, the pre-amplifier IC 9 is mounted on the wiring lead integrated resin substrate 1 and the electric wirings between the pre-amplifier IC 9 and the electrode pattern 3b for the photo-diode 11 as well as the signal lines 1c formed on the wiring lead integrated resin substrate 1 are made by the bonding wires. In this wiring, there is a need to take cares for suppressing the wire length short so as not to cause the degradation of high frequency signals. By manufacturing the optical module in this way, it becomes possible to realize the photo-detection of optical signals up to 20 GHz.

The optical module of this embodiment in the above described configuration operates well, for over 5000 hours even under the environment of 75° C. and 90% relative humidity as well as under the environments ranging from −40° C. to 75° C.

Note that, in the embodiment shown in FIG. 6, the wiring lead integrated resin substrate 1 is integrally formed with the resin substrate having the signal lines 1c formed thereon, but it is also possible to use a modified structure in which a resin substrate without signal lines 1c is formed as a base, and another resin substrate with signal lines 1c formed thereon is provided on this base resin substrate.

Figure 7:
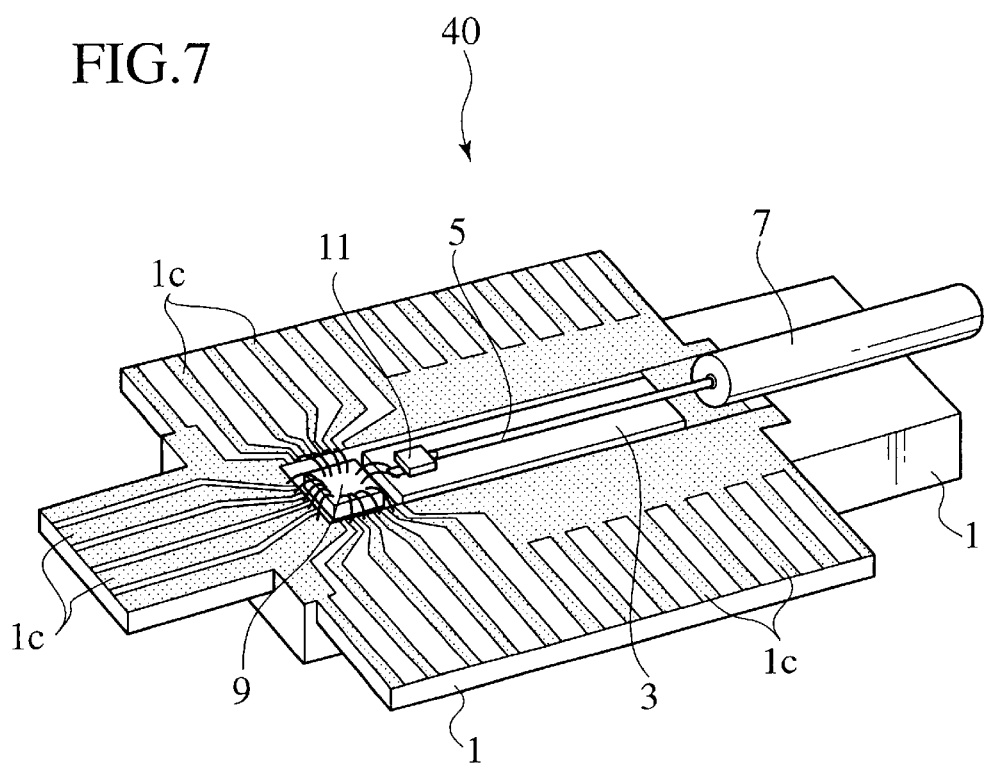
FIG. 7 is a perspective view showing a structure of a photo-detecting optical module according to one embodiment of the present invention.

FIG. 7 shows a perspective view of a configuration of a photo-detecting optical module formed by using the wiring lead integrated resin substrate 1 and the optical element mounting block 3 similar to those of the optical module of FIG. 6. The photo-detecting optical module 40 of FIG. 7 has a configuration in which portions with the signal lines 1c of the wiring lead integrated resin substrate 1 formed thereon in the optical module of FIG. 6 are extended in the lateral directions, and the signal lines 1c are extended to cover the surrounding of the optical element mounting block housing section 1a entirely. The other basic structure is similar to that of the optical module of FIG. 6 so that the same constituent elements are given the same reference numerals in the figures and their description will be omitted here.

Note that, similarly as in the embodiment of FIG. 6, in the photo-detecting optical module 40 of FIG. 7, the wiring lead integrated resin substrate 1 is integrally formed with the resin substrate having the signal lines 1c formed thereon, but it is also possible to use a modified structure in which a resin substrate without signal lines 1c is formed as a base, and another resin substrate with signal lines 1c formed thereon is provided on this base resin substrate.

Figure 1:
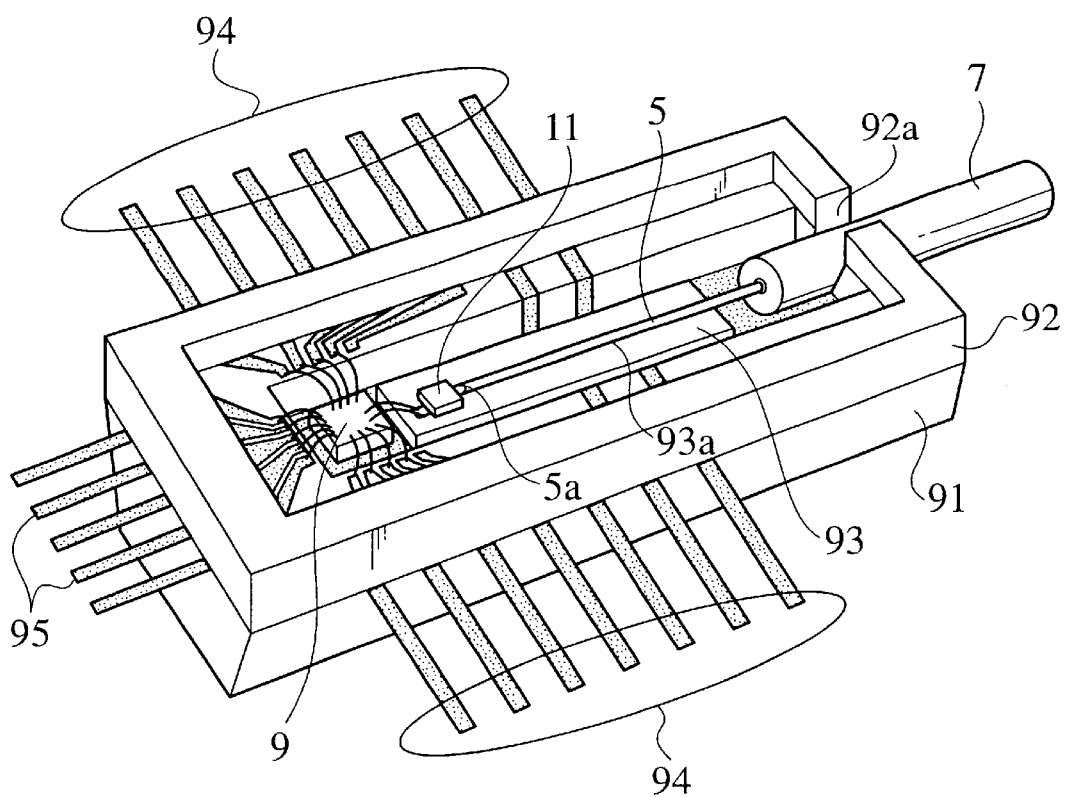
FIG. 1 is a perspective view showing a structure of a conventional optical module.
Figure 2:
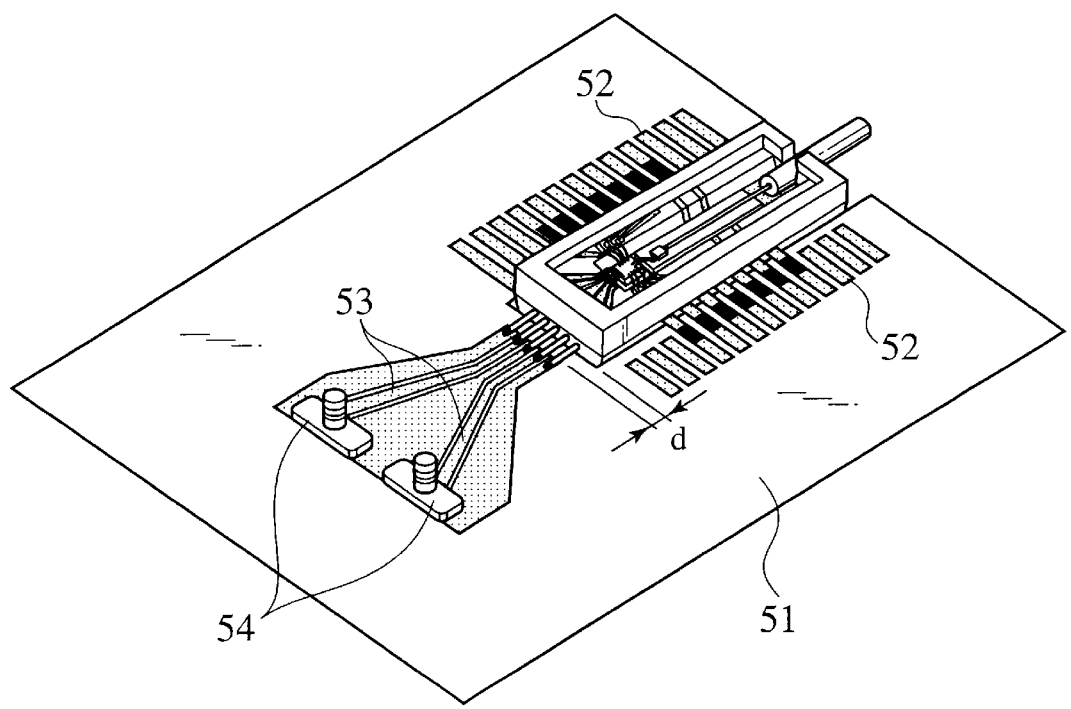
FIG. 2 is a perspective view showing a state in which the conventional optical module of FIG. 1 is implemented on a glass epoxy frequency characteristic evaluation substrate.
Figure 8:
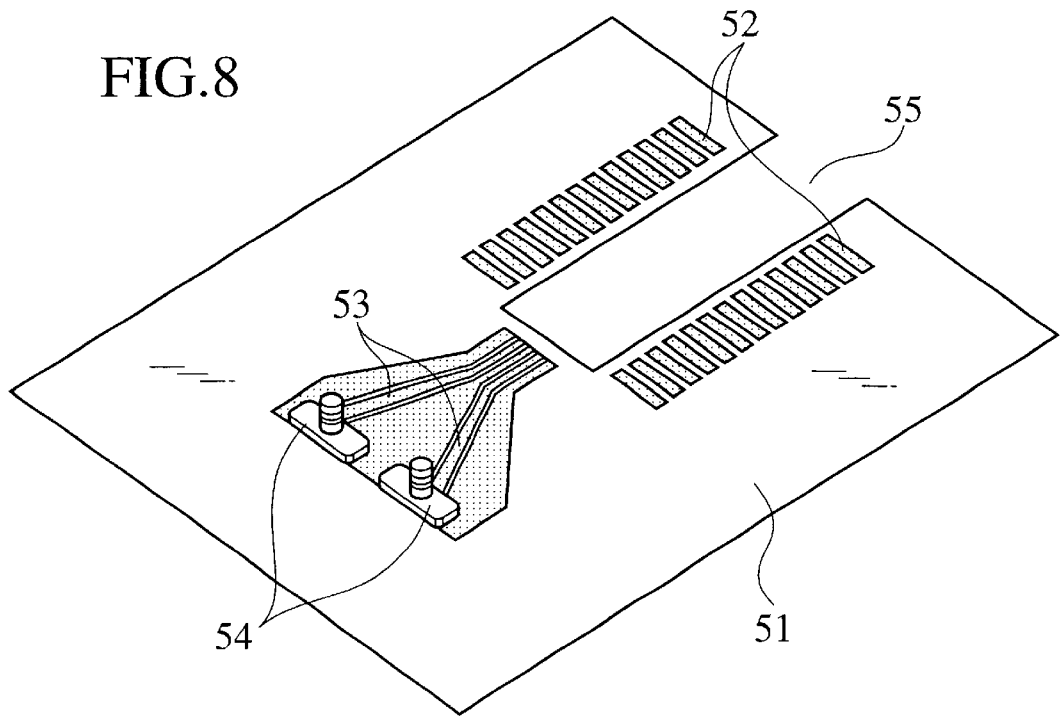
FIG. 8 is a perspective view showing a glass epoxy frequency characteristic evaluation substrate for evaluating a receiving bandwidth characteristic of the photo-detecting optical module of FIG. 7.

FIG. 8 shows a glass epoxy frequency characteristic evaluation substrate manufactured in order to evaluate an actual receiving bandwidth of the optical module when optical signals are entered into the photo-detecting optical module 40 of FIG. 7, that is, the glass epoxy frequency characteristic evaluation substrate 51 for the photo-detecting optical module similar to that shown in FIG. 2. On this glass epoxy frequency characteristic evaluation substrate 51, signal lines 53 in a coplanar guide structure are formed similarly as the signal lines 1c formed on the wiring lead integrated resin substrate 1 of the photo-detecting optical module 40 of FIG. 7. In addition, this glass epoxy frequency characteristic evaluation substrate 51 has a cut-out section 55 in which the photo-detecting optical module 40 of FIG. 7 is to be placed for the purpose of the evaluation test, and a plurality of electrode pads 52 to which the signal lines 1c of the photo-detecting optical module 40 are to be electrically connected are formed on both sides of this cut-out section 55.

Figure 9:
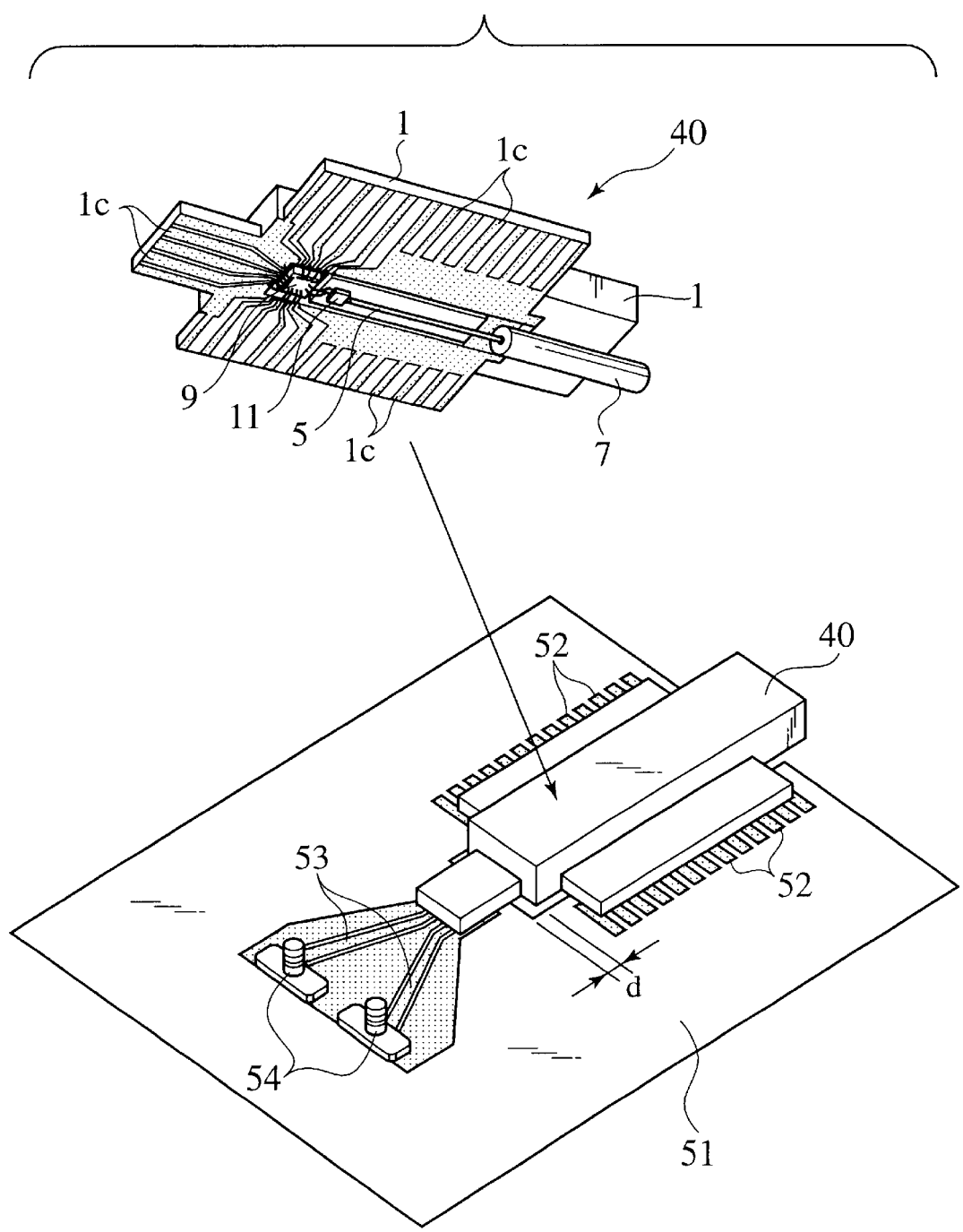
FIG. 9 is a perspective view showing a state in which the photo-detecting optical module of FIG. 7 is implemented on the glass epoxy frequency characteristic evaluation substrate of FIG. 8.

FIG. 9 shows a perspective view of a state in which the photo-detecting optical module 40 of FIG. 7 is implemented on the glass epoxy frequency characteristic evaluation substrate 51 of FIG. 8 such that the signal lines 1c of the photo-detecting optical module 40 are electrically connected with the electrode pads 52 and the signal lines 53 of the glass epoxy frequency characteristic evaluation substrate 51.

In this configuration where the photo-detecting optical module 40 is implemented on the glass epoxy frequency characteristic evaluation substrate 51, the dielectric constant of the glass epoxy frequency characteristic evaluation substrate 51 is approximately 4.8, which is a value close to the dielectric constant 4.2 of the wiring lead integrated resin substrate 1 of the photo-detecting optical module 40, so that by setting nearly the same widths for the signal lines in the coplanar guide structure on both of them, the characteristic impedances of both of them can be matched.

Also, even if there is a gap "d" as shown in FIG. 9 between the glass epoxy frequency characteristic evaluation substrate 51 and the photo-detecting optical module 40, the characteristic impedance of the signal lines in the coplanar guide structure on the wiring lead integrated resin substrate 1 of the photo-detecting optical module 40 will hardly change. Consequently, by adopting the implementation as shown in FIG. 9, it is possible to obtain a good high frequency characteristic even when there is a tolerable displacement in the implemented position, and therefore a considerable improvement in the fabrication yield for high speed operation optical modules can be expected.

Figure 3:
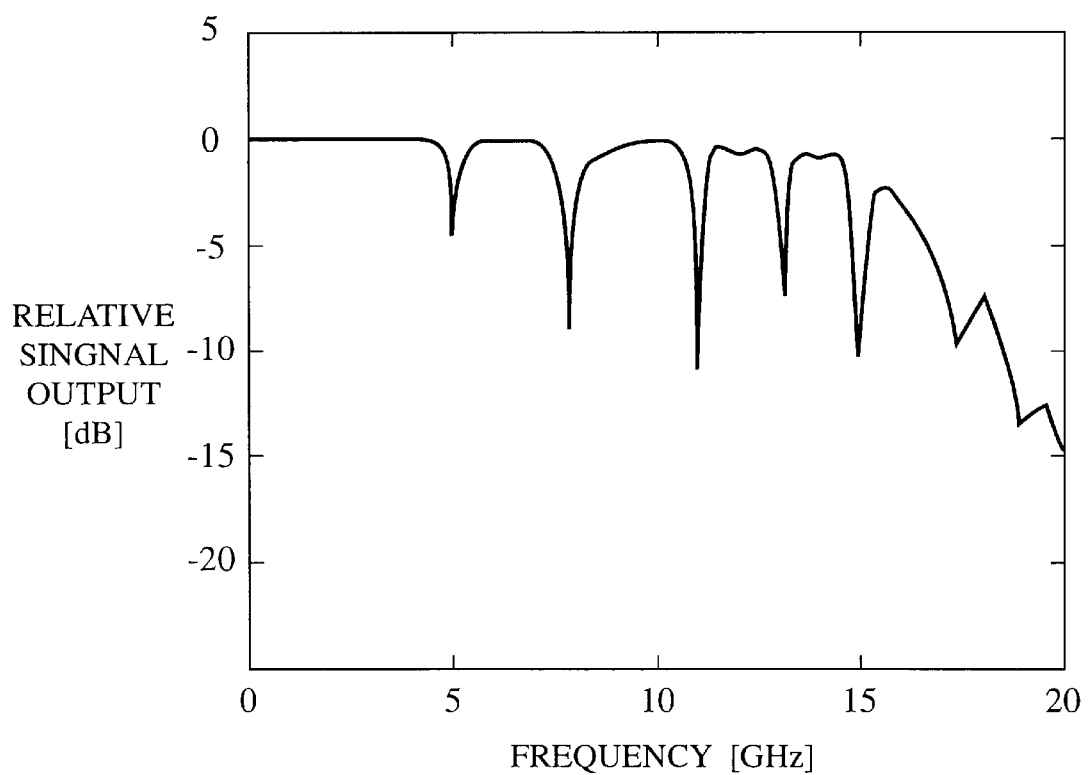
FIG. 3 is a graph showing a receiving bandwidth characteristic of the conventional optical module of FIG. 1 measured by using the implementation shown in FIG. 2.
Figure 10:
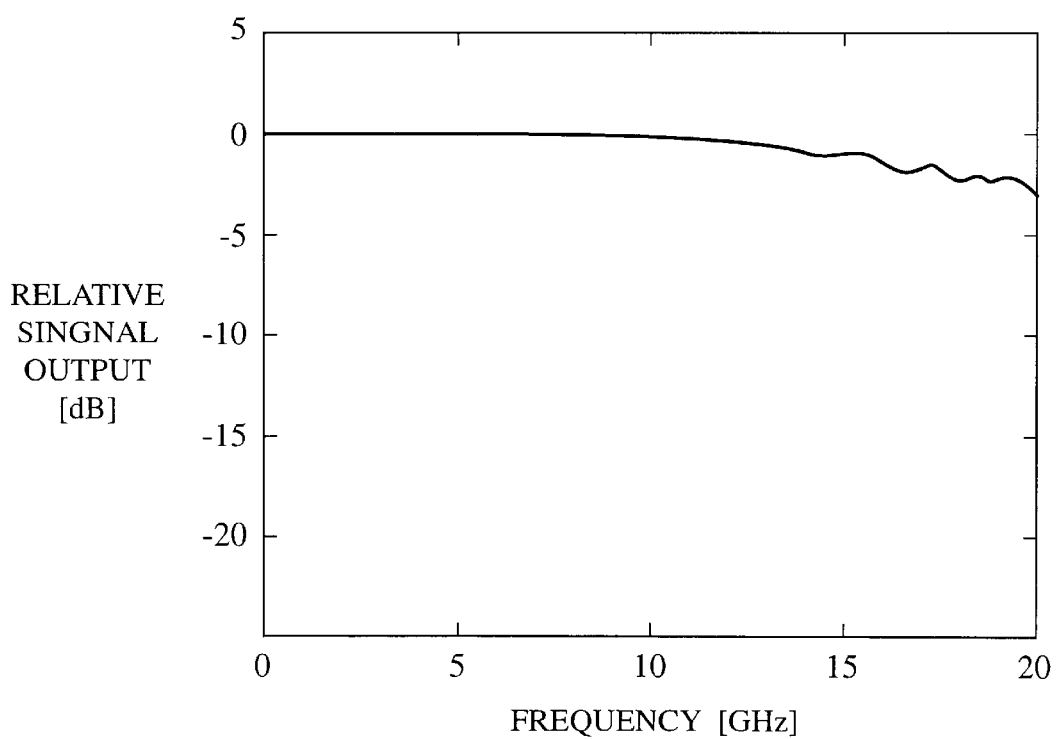
FIG. 10 is a graph showing a receiving bandwidth characteristic of the photo-detecting optical module of FIG. 7 measured by using the implementation shown in FIG. 9.

FIG. 10 shows a graph indicating the receiving bandwidth characteristic of the photo-detecting optical module 40 that was measured in the implementation shown in FIG. 9. In this measurement, there was a gap "d" of approximately 1 mm between the glass epoxy frequency characteristic evaluation substrate 51 and the photo-detecting optical module 40 as shown in FIG. 9, but as shown in FIG. 10, no influence of electrical reflections or resonances appears up to 20 GHz and a good frequency characteristic was observed. In particular, as can be seen from a comparison with the receiving bandwidth evaluation result for the conventional photo-detecting optical module as shown in FIG. 3, for the photo-detecting optical module 40 of this embodiment, there is no large ripple due to electrical reflections and a good frequency characteristic was obtained.

Figure 11:
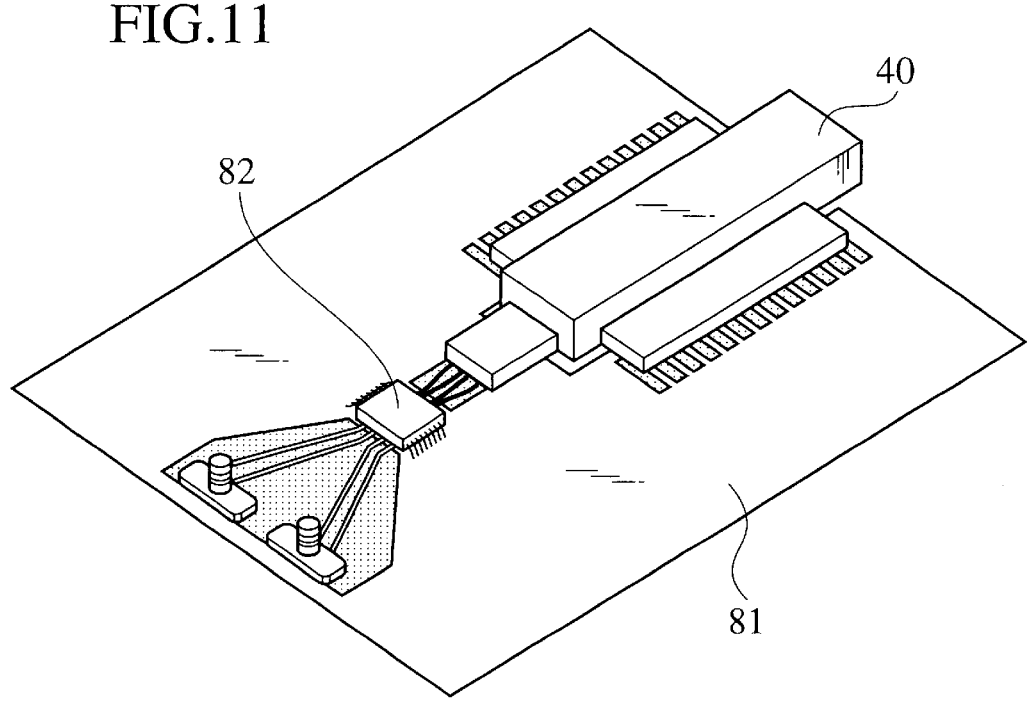
FIG. 11 is a perspective view showing a state in which the photo-detecting optical module of FIG. 7 is implemented on an optical signal received waveform evaluation substrate.

FIG. 11 shows a perspective view in which the photo-detecting optical module of FIG. 7 implemented on an optical signal received waveform evaluation substrate which is manufactured by mounting a main amplifier IC 82 on a glass epoxy substrate 81 similar to the glass epoxy frequency characteristic evaluation substrate 51 of FIG. 8, in order to carry out the 10 Gbps optical signal received waveform evaluation with respect to the photo-detecting optical module 40 of FIG. 7.

As explained with reference to FIG. 4, the main amplifier IC 82 is an amplifier having an automatic gain control (AGC) function of the operation frequency bandwidth approximately equal to 10 GHz, which outputs signals having a constant amplitude by uniformly amplifying the received signals as amplified by the pre-amplifier IC 9 used in the optical module of FIG. 7. Using such an optical signal received waveform evaluation substrate, it is possible to output electric signals suitable for the bit error rate characteristic evaluation that is often used for the received waveform observation and the transmission characteristic evaluation.

Figure 5:
FIG. 5 is an output waveform diagram showing a received waveform of the conventional optical module of FIG. 1 observed by using the implementation shown in FIG. 4.
Figure 12:
FIG. 12 is an output waveform diagram showing a received waveform of the photo-detecting optical module of FIG. 7 observed by using the implementation shown in FIG. 11.

In this received waveform evaluation, optical signals modulated by 10 Gbps pseudo-random pattern (NRZ$2^{23}$–1) are entered into the photo-detecting optical module 40 from an external through the optical fiber 5. The average power of the received optical signals in this case was –10 dBm. FIG. 12 shows the received waveform outputted from the main amplifier IC 82 of FIG. 11 in this case as observed by using a wide bandwidth oscilloscope having a bandwidth of 20 GHz. As can be seen in FIG. 12, a good eye pattern was observed for the 10 Gbps received optical signals, compared with a largely degraded waveform eye pattern shown in FIG. 5 for the conventional optical module.

Figure 4:
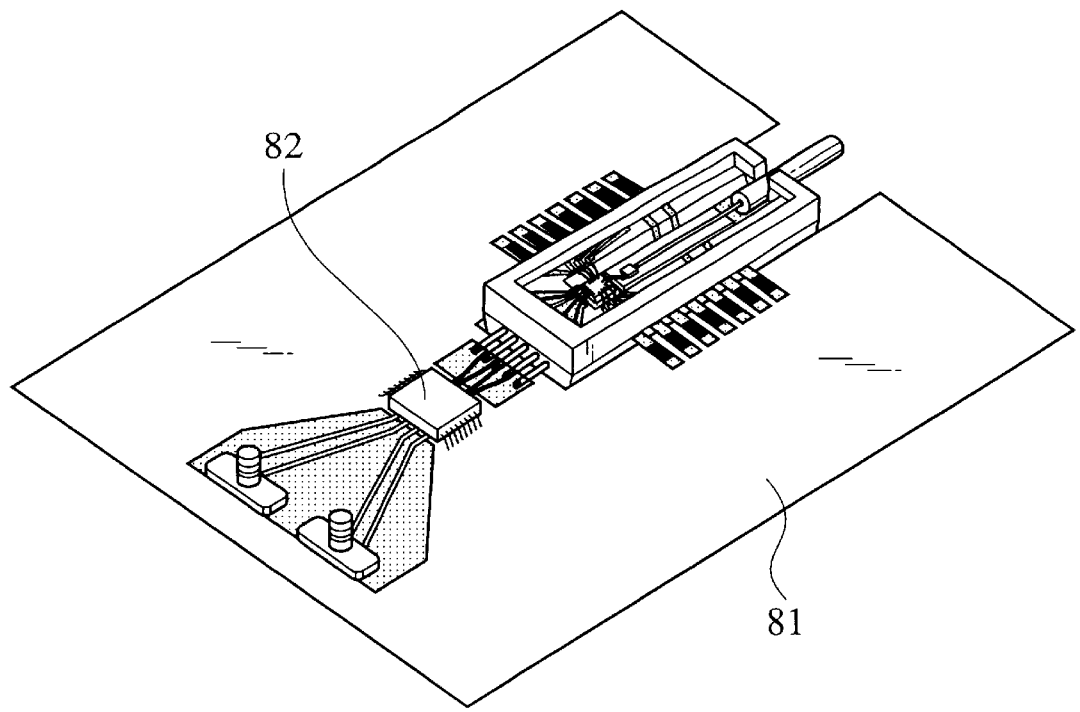
FIG. 4 is a perspective view showing a state in which the conventional optical module of FIG. 1 is implemented on an optical signal received waveform evaluation substrate.

Also, when the bit error rate characteristic was evaluated in a vicinity of the average power of –10 dBm using the optical signal received waveform evaluation substrate of FIG. 11 with respect to the photo-detecting optical module 40 of FIG. 7, it was possible to realize a completely error free operation without any code recognition error in the case of the photo-detecting optical module 40 of this embodiment, in contrast to the case of the conventional optical module of FIG. 4 for which it was impossible to realize a completely error free operation without any code recognition error.

As described above, according to the optical module of the present invention, the optical axes of the optical fiber and the optical elements are aligned while guiding the optical fiber along the optical fiber guide formed on the optical element mounting block provided in the wiring lead integrated resin substrate such that they are optically connected while maintaining a state in which their optical axes are aligned, and the ferrule holding the optical fiber is fixedly held at the ferrule holding section formed on the wiring lead integrated resin substrate, so that it is possible to process high speed signals of 10 Gbps or more by using an economical resin substrate, it is possible to realize a good frequency characteristic without any influence of electrical reflections or resonances, and it is possible to realize a completely error free operation without any code recognition error.

Also, according to the optical module of the present invention, it is possible to guide the optical fiber by the optical fiber guide in the V-groove structure such that the optical axis alignment with respect to the optical element can be realized accurately and the optical fiber and the optical element can be optically connected while maintaining a state in which their optical axes are aligned.

Also, according to the optical module of the present invention, it is possible to guide the optical fiber by the optical fiber guide in the circular hole structure such that the optical axis alignment with respect to the optical element can be realized accurately and the optical fiber and the optical element can be optically connected while maintaining a state in which their optical axes are aligned.

Also, according to the optical module of the present invention, the wiring leads are provided by the plating pattern formed on resin so that the mass production of a pattern with wiring interval of less than or equal to 100 μm can be realized easily, and a three-dimensional wiring circuit can be formed by plating an injection molded body surface and then patterning, for example.

Also, according to the optical module of the present invention, it is possible to engage the optical module with the optical connector adaptor by using the hooking section.

Also, according to the optical module of the present invention, a part of the wiring leads are provided in the coplanar guide structure having a specific characteristic impedance, so that it is possible to realize the signal transmission bandwidth up to a high frequency range of 10 Gbps or more, without using a multi-layer substrate structure.

Also, according to the optical module of the present invention, the wiring lead integrated resin substrate is manufactured by manufacturing an overall structure by the the injection molding technique using a metal mold, then forming resin that is soluble by solvent by the insert molding at a portion that is not to be plated, then applying the electroless plating to the surface, and then removing the resin portion formed on the surface, so that the mass production of a pattern with wiring interval of less than or equal to 100 μm can be realized easily.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. An optical module for converting optical/electric signals into electric/optical signals by optically connecting an optical element having electric wirings with an optical fiber held by a ferrule and having a tip end portion without jacketing layers that is projecting from the ferrule the optical module comprising:

an optical element mounting block having an optical element mounting section for mounting the optical element, and an optical fiber guide for guiding the optical fiber to align optical axes of the optical fiber and the optical element, such that the optical fiber is optically connected with the optical element while maintaining a state in which optical axes of the optical fiber and the optical element are aligned; and a wiring lead integrated resin substrate having a ferrule holding section for holding the ferrule, an optical element mounting block housing section for housing the optical element mounting block, and wiring leads to which the optical element is electrically wired;

wherein at least a part of the wiring leads are provided by signal lines in a coplanar guide structure entirely formed on the wiring lead integrated resin substrate such that a characteristic impedance does not change when the wiring leads are electrically connected to external wirings; and the signal lines are entirely formed on a resin substrate projecting from the optical element mounting block housing section of the wiring lead integrated resin substrate such that the signal lines can be electrically connected to the external wirings without being exposed between the optical module and the external wirings.

2. The optical module of claim 1, wherein the wiring leads are provided by a plating pattern formed on resin constituting the wiring lead integrated resin substrate.

3. The optical module of claim 2, wherein the plating pattern has a wiring interval of less than or equal to 100 μm.

4. An optical module for converting optical/electric signals into electric/optical signals by optically connecting an optical element having electric wirings with an optical fiber held by a ferrule and having a tip end portion without jacketing layers that is projecting from the ferrule, the optical module comprising:

an optical element mounting block having an optical element mounting section for mounting the optical element, and an optical fiber guide for guiding the optical fiber to align optical axes of the optical fiber and the optical element, such that the optical fiber is optically connected with the optical element while maintaining a state in which optical axes of the optical fiber and the optical element are aligned; and a wiring lead integrated resin substrate having a ferrule holding section for holding the ferrule, an optical element mounting block housing section for housing the optical element mounting block, and wiring leads to which the optical element is electrically wired;

wherein at least a part of the wiring leads are provided by signal lines in a coplanar guide structure entirely formed on the wiring lead integrated resin substrate such that a characteristic impedance does not change when the wiring leads are electrically connected to external wirings; and the wiring lead integrated resin substrate is manufactured by a molded interconnect devices method.

5. The optical module of claim 4, wherein the wiring lead integrated resin substrate is made of a material having sufficient heat resistance and insulation properties and no dielectric dispersion in a frequency region to be used.

6. The optical module of claim 5, wherein the wiring lead integrated resin substrate is made of epoxy resin or engineering plastic material including liquid crystalline polymer.

7. The optical module of claim 4, wherein the wiring lead integrated resin substrate is manufactured by manufacturing an overall structure by an injection molding technique using a metal mold, forming resin that is soluble in solvent by an insert molding on a portion of a surface of the overall structure that is not to be plated, plating the surface, and removing the resin formed on the surface by using the solvent.

8. The optical module of claim 7, wherein the wiring lead integrated resin substrate is manufactured by using the solvent which is polyvinyl alcohol or polylactic acid.

* * * * *